United States Patent [19]

Ohta

[11] Patent Number: 4,670,767
[45] Date of Patent: Jun. 2, 1987

[54] HETERO-JUNCTION BIPOLAR TRANSISTOR HAVING A HIGH SWITCHING SPEED

[75] Inventor: Kuniichi Ohta, Tokyo, Japan

[73] Assignee: NEC Corporation, Tokyo, Japan

[21] Appl. No.: 696,336

[22] Filed: Jan. 30, 1985

[30] Foreign Application Priority Data

Jan. 30, 1984 [JP] Japan ................................. 59-14651

[51] Int. Cl.$^4$ ............................................. H01L 29/72
[52] U.S. Cl. ........................................ 357/34; 357/16; 357/61
[58] Field of Search .............................. 357/16, 34, 61

[56] References Cited

U.S. PATENT DOCUMENTS 4,173,763  11/1979  Chang et al. ...................... 357/34 X

OTHER PUBLICATIONS

Kroemer, "Heterostructure Bipolar Transistors and Integrated Ckts", Proc. IEEE, vol. 70, No. 1, Jan. 1982.
Laod, Jr., "Performance Potential of High-Frequency Heterojunct Transistors", IEEE Trans. on Ele. Dev., vol. ED-17, No. 5, 5/1970.

*Primary Examiner*—Andrew J. James
*Assistant Examiner*—S. Crane
*Attorney, Agent, or Firm*—Burns, Doane, Swecker & Mathis

[57] ABSTRACT

The bipolar transistor comprises an emitter of a first semiconductor, a base of a second semiconductor and a collector of a third semiconductor, the first semiconductor having edges of conduction and valence bands positioned outside the energy band gap of the second semiconductor, and the third semiconductor having an edge of conduction band for majority carriers positioned inside the energy band gap of the second semiconductor and an edge of valence band for majority carriers positioned outside the energy band gap of the second semiconductor.

24 Claims, 11 Drawing Figures

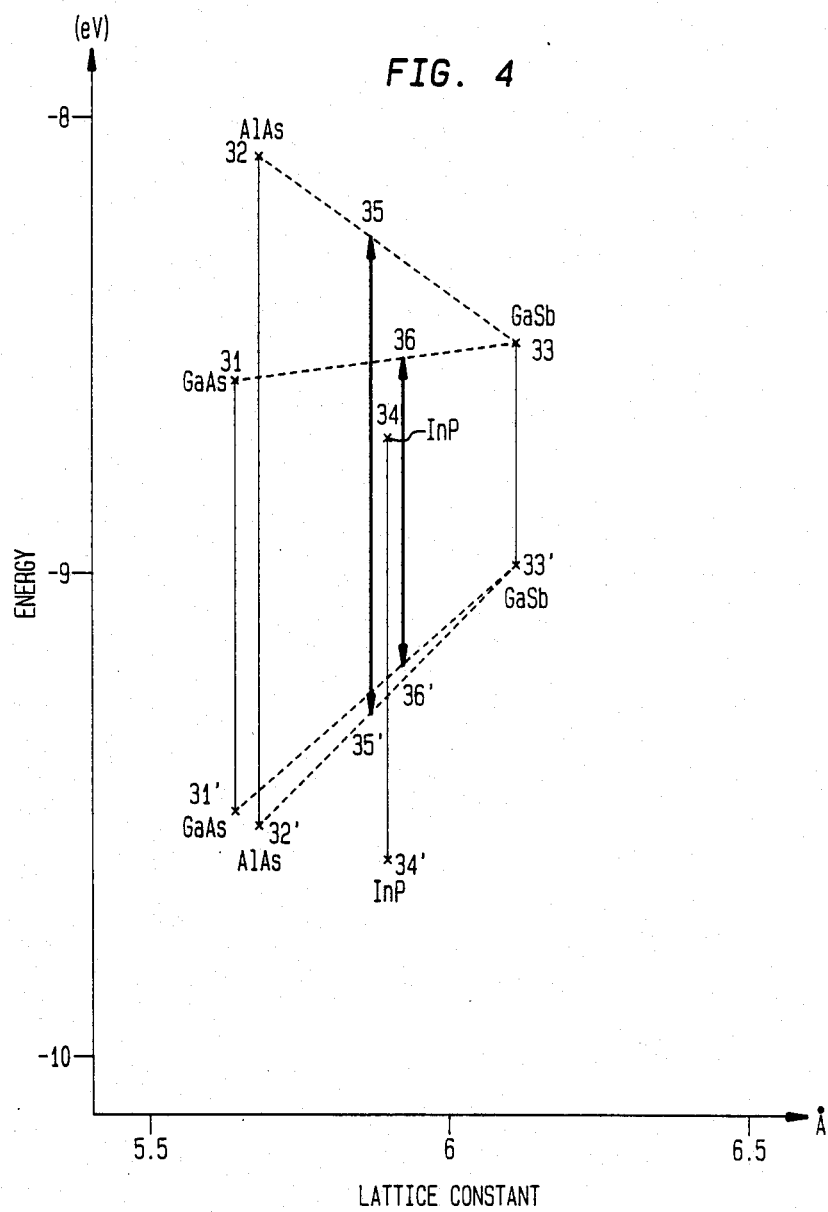

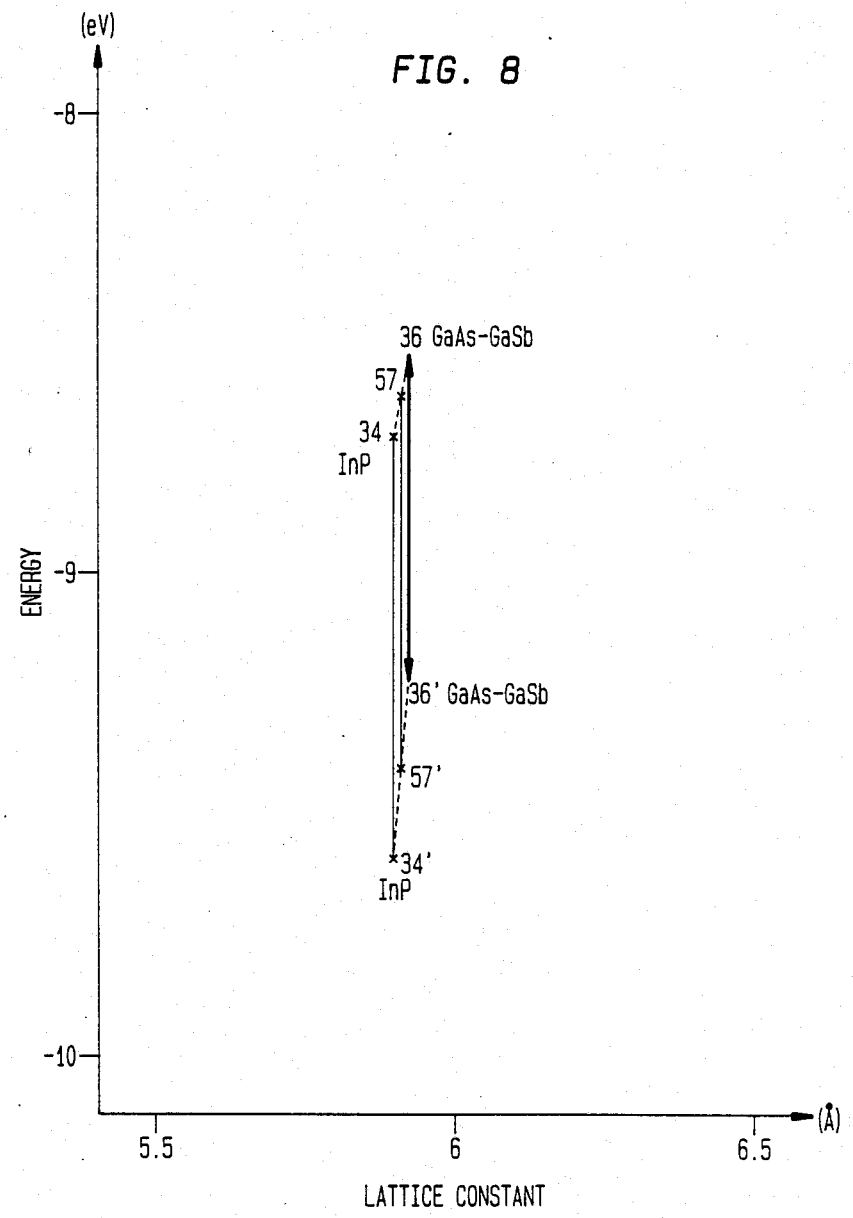

HETERO-JUNCTION BIPOLAR TRANSISTOR HAVING A HIGH SWITCHING SPEED

BACKGROUND OF THE INVENTION

1. Field of the Invention:

The present invention relates to a bipolar transistor, and more particularly to a structure for improving the gain and the switching speed of the bipolar transistor.

2. Description of the Prior Art:

The bipolar transistor has a higher operating speed than the field effect transistor and, therefore, has been widely used in computers and so on. The bipolar transistor, however, has a limited switching speed, due to carriers accumulated in the collector region. That is, when the conducting operation is saturated, the base-collector junction is forward biased to allow the injection of minority carriers into the collector region, resulting in an accumulation of carriers in the collector region. Once saturated, the transistor does not turn off until the accumulated carriers are drained. This is a cause of the limited switching speed. In order to prevent the transistor from being saturated, an ECL circuit uses a high power voltage. However, the transistor structure used in the ECL circuit is so large that it may withstand the high power operation. Such large structure is a bar for a large integration of integrated circuit.

As another structure for preventing the transistor from the charge accumulation in collector region, a hetero-junction was used for the collector junction as disclosed in [PROCEEDINGS OF THE IEEE] Vol. 70, No. 1 (January 1982), pages 64 to 76. The collector of the proposed structure was made of a semiconductor material having conduction and valence bands positioned outside the band gap of the semiconductor material of the base. According to such structure, when the transistor is saturated, there is generated a barrier between base and collector against the minority carriers in the collector. Therefore, the minority carriers are not injected from the base and are not accumulated in the collector. However, the minority carriers in the base are injected from the collector to the base. Due to the accumulation of the charges of minority carriers in the base, the switching speed of the transistor is still slow. Furthermore, when the base-collector junction is backward biased for normal operation, there is generated also a barrier for majority carriers in the collector which are injected from the emitter through the base, resulting in a small gain. The small gain is improved by grading the energy band between the base and the collector. But such band grading weakens the effect of preventing the minority carrier accumulation.

SUMMARY OF THE INVENTION

The primary object of the present invention is to provide a bipolar transistor having a high switching speed and a high gain.

According to the present invention, there is provided a bipolar transistor having an emitter of one conductivity type made of a first material, a base of the other conductivity type made of a second material and a collector of the one conductivity type made of a third material, the first material having a conduction band and a valence band positioned outside a band gap of the second material under a non-bias condition, the edge of the conduction band of the third material for the majority carriers positioned inside the band gap of the second material under a non-bias condition, and the edge of the valence band of the third material for minority carriers positioning outside the band gap of the second material under a non-bias condition.

According to another aspect of the present invention, there is provided a transistor having a base-collector junction made of semiconductor materials such that, due to a discontinuity of energy levels at the base-collector junction, the injections of minority carriers to both the base and collector regions may be prevented even when the base-collector junction is forward biased.

According to the present invention when the base-collector junction is forward biased by saturation, there is generated large barriers between the base and the collector for both the flows of carriers from the base to the collector and from the collector to the base. The barriers block the injection of the minority carriers into the collector and the base and prevent the minority carriers from being accumulated in the collector and the base. Therefore, the switching speed of the transistor according to the present invention is greatly improved.

Furthermore, the first material has such a wide band gap that the conduction and valence bands position outside the band gap of the second material, while the barrier between the emitter and base for the minority carriers in the second material is low, the barrier therebetween for the majority carriers in the second material is high. Such emitter and base structure has a high injection efficiency of minority carriers into the base. In addition, there is no barrier between the base and the collector for the minority carriers in the second material when the base-collector junction is backward biased, that is when the transistor is normally biased. Thus, the transistor according to the present invention has a large gain due to the high injection efficiency and no barrier between the backward biased base-collector junction.

BRIEF DESCRIPTION OF THE DRAWINGS

The above and further objects, features and advantages of the present invention will become more apparent from the following detailed description taken in conjunction with the accompanying drawings, wherein:

FIG. 4 is a diagram showing a relationship between energy levels and lattice constants of the compound semiconductors usable for embodying the example shown in FIG. 3;

FIG. 8 is a diagram showing a relationship between energy levels and lattice constants of the compound semiconductors usable for the base-collector junction in the second example shown in FIG. 6 (a).

Figure 1A:
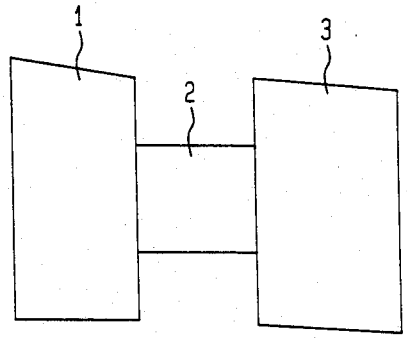
FIG. 1 (a) is an energy band diagram of a non-biased transistor in the prior art and FIG. 1 (b) is an energy band diagram of the backward biased base-collector junction in the prior art.
Figure 1B:
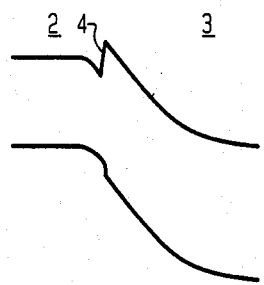

The transistor in the prior art for preventing carrier accumulation in the collector is shown in FIG. 1 (a) in an energy band diagram. The N-type semiconductors of the emitter 1 and the collector 3 have a wider band gap than the P-type semiconductor of the base. The conduction and valence bands of the emitter and collector materials position outside the band gap of the base material.

If the transistor is driven into conducting to be saturated, the bias condition to the junction between the base 2 and the collector 3 becomes a forward bias. Since the valence band of the collector material keeps lower than the band gap of the base material to form a barrier, the injection of holes into the collector 3 is blocked by the barrier. However, since the conduction band of the collector materials keeps higher than the band gap of the base material, electrons flow from the collector 3 to the base 2 to form an accumulation of electrons in the base 3. The electron accumulation keeps the switching speed of the transistor still slow.

Furthermore, when the base-collector junction is backward biased to perform the normal transistor operation, a notch 4 occurs at the base-collector junction as shown in FIG. 1 (b). By the notch 4, the flow of electrons to the collector 3 is blocked to decrease the number of electrons which reach the collector 3.

Figure 2:
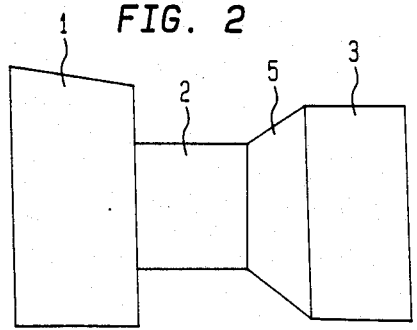
FIG. 2 is an energy band diagram of another non-biased transistor in the prior art.

Another transistor in the prior art prevented the notch 4 from being generated is shown in FIG. 2. Additional semiconductor material 5 is inserted between the base 2 and the collector 3 to grade the band gap therebetween. According to such structure, while the blocking of the electrons flowing to the collector 3 does not occur, the preventing effect of the carrier accumulation in the collector 3 and the base 2 is weakened.

Furthermore, the use of the wide band gap material for the collector 3 raises another drawback. The wide band gap material has a slow mobility, and therefore, has a large resistivity. Therefore, the collector 3 of such wide band gap material cannot sufficiently draw electrons in the base 2. The electrons injected from the emitter 1 to the base 2 overflow to the collector 3 to effectively widen the base width. The high frequency characteristics deteriorates. This is a so-called Kirk effect.

DETAILED DESCRIPTION OF THE EMBODIMENTS

Figure 3:
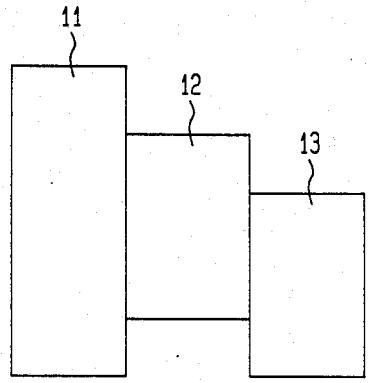
FIG. 3 is an energy band diagram of a first example of the present invention which is not biased.

A first example of the present invention is shown in FIG. 3 in a form of an energy band gap diagram. An emitter 11 is made of an N-type semiconductor material having conduction and valence bands positioned outside the band gap of a P-type semiconductor material of a base 12. The edge of a conduction band of the N-type semiconductor material of the collector 13 positions inside the band gap of the base material. The edge of a valence band of the collector material is lower than the edge of the valence band of the base material.

The transistor having such energy band gap structure shown in FIG. 3 has a superior minority carrier injection coefficient, as well as the transistors in the prior art shown in FIGS. 1 (a) and 2, because a wide band gap semiconductor is used for the emitter 11. The accumulation of minority carriers in both the base 12 and the collector 13 is prevented. The conduction band of the base material keeps higher than the band gap of the collector material to form a barrier when the junction between the base 12 and the collector 13. Such barrier blocks the flow of electrons from the collector 13 to the base 12. Similarly, the valence band of the collector material keeps lower than the band gap of the base material to form another barrier when the junction is forward biased. The barrier blocks the flow of holes from the base 12 to the collector 13. Thus electrons and holes are not accumulated in the base 12 and the collector 13 to greatly improve the switching speed of the transistor. Furthermore, since the edge of the conduction band of the collector material is inside the band gap of the base material, any barrier for electrons is not formed at the base-collector junction, when the transistor is normally biased and the base-collector junction is backward biased. The flow of electrons to the collector 13 is not blocked to ensure a large gain for the transistor. The band gap of the collector material is narrow, compared to the collector material used in the transistors in the prior art. The electrons injected from the emitter 11 to the base 12 are strongly drawn to the collector 13. The overflow of electrons from the base 12 to the collector 13 does not occur. That is, the so-called Kirk effect is prevented to ensure the superior high frequency characteristics.

In order to prevent the charge accumulation in the base and collector, to obtain a high gain and to prevent the Kirk effect, the difference between edges of the conduction bands of the semiconductor materials of the base and collector regions is selected in a range from 0.1 to 0.9 times of the energy band gap of the semiconductor material of the base. Similarly, the difference between edges of the valence bands of the semiconductor materials of the base and collector regions is selected in a range from 0.1 to 0.9 times of the energy band gap of the semiconductor material of the collector.

The base 12 and the collector 13 are preferably formed to form a hetro-junction. According to such hetro-junction structure, the energy band gap structure of the base 12 and the collector 13 is formed with band gaps inherent in the semiconductor materials. The band gap structure is not disturbed, if impurities are heavily doped into the base 12 and the collector 13. Therefore, base and collector resistances may be lowered with keeping the above-mentioned features.

Next, the materials usable for the emitter 11, the base 12 and the collector 13 will be explained with reference to FIG. 4. The edges of the conduction bands 31, 32, 33, 34, 35 and 36 and the edges of the valence bands 31', 32', 33', 34', 35' and 36' of GaAs, AlAs, GaSb, InP and mixed semiconductors of AlAs-GaSb and GaAs-GaSb with their lattice constants in FIG. 4. The energy band gap and the lattice constant can be changed as shown by the dotted lines by changing the ratio of semiconductors in the mixed semiconductor. If the ratio of AlAs and GaSb and the ratio of AlAs and GaSb are selected so that the lattice constants of those mixed semiconductors may be nearly the same as InP, the relationship between energy band gaps of the mixed semiconductor of AlAs and GaSb (35—35') having a ratio of 2 and 1, the mixed semiconductor of GaAs and GaSb (36—36') having a ratio of 2 and 3 and the semiconductor of InP (34—34') satisfies the relationship of energy band gaps of the emitter 11, the base 12 and the collector 13 of the transistor shown in FIG. 3. Thus, the transistor shown in FIG. 3 may be formed by using such mixed semiconductor of AlAs-GaSb (35—35') as the emitter 11, such mixed semiconductor of GaAs-GaSb (36—36') as the base 12 and the semiconductor of InP (34—34') as the collector 13. Those semiconductors of AlAs-GaSb, GaAs-GaSb and InP are doped with Si, Zn, Si to make them N-type, P-type and N-type, respectively.

Figure 5:
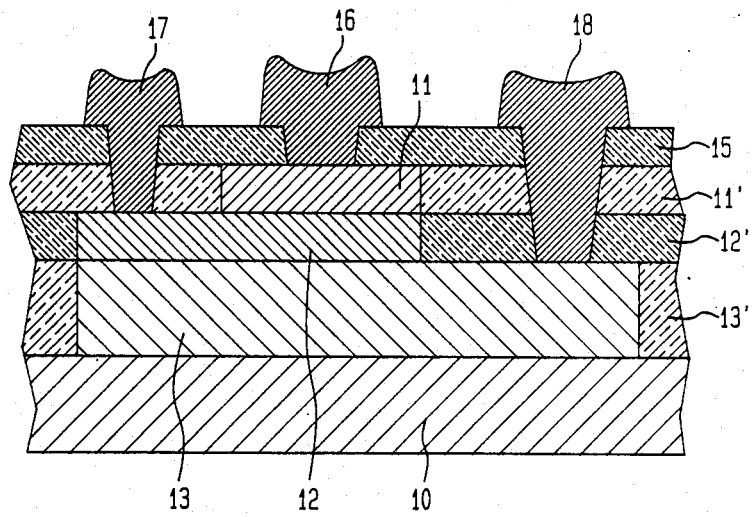
FIG. 5 is a sectional view of a first embodiment of the present invention which embodies the first example shown in FIG. 3.

The embodiment of the transistor formed by using such semiconductors is shown in FIG. 5. A semi-insulator semiconductor of non-doped InP is used as a substrate 10. On the substrate 10, the Si-doped InP is grown with a thickness of 100 μm to form the collector 13. The donor concentration of the Si-doped InP is $10^{17}$ cm$^{-3}$. The undesired part of the Si-doped InP is converted into an insulator material 13' by doping oxygen. The Zn-doped GaAs-GaSb is then grown on the collector 13 and the insulator material 13 with a thickness of 0.2 μm and an acceptor concentration of $10^{18}$ cm$^{-3}$. The undesired part of the Zn-doped GaAs-GaSb is converted into an insulator material 12' by doping oxygen to form the base 12 on the collector 13. The Si-doped AlAs-GaSb is then grown on the base 12 and the insulator material 12' with a thickness of 0.1 μm and a donor concentration of $10^{18}$ cm$^{-3}$. The undesired part of the Si-doped AlAs-GaSb is similarly converted into an insulator material 11' by doping oxygen to form the emitter 11 on the base 12. Finally, $SiO_2$ 15 is deposited on the emitter 11 and the insulator material 11' for a passivation. Thereafter, parts of the collector 13, the base 12 and the emitter 11 are exposed by selective etching of the $SiO_2$ 15 and the insulator materials 11' and 12'. The emitter electrode 16, the base electrode 17 and the collector electrode 18 are formed with aluminum.

Figure 6A:
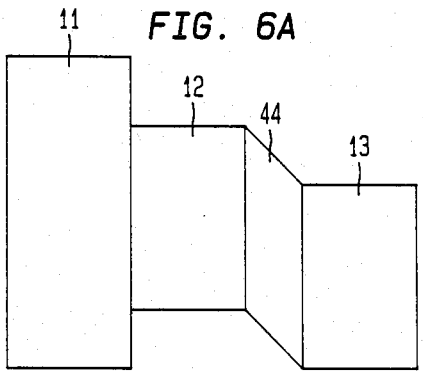
FIG. 6 (a) is an energy band diagram of a second example of the present invention and FIG. 6 (b) is an energy level diagram of the base-collector junction of the second example shown in FIG. 6 (a)
Figure 6B:
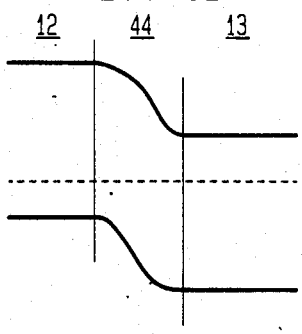

Another example of the energy band gap structure of the transistor according to the present invention is shown in FIG. 6(a). An additional region 44 is inserted between the base 12 and the collector 13 to form a grade of band gap at the base-collector junction. The energy level diagram at the base-collector junction thus obtained is shown in FIG. 6(b).

Figure 7A:
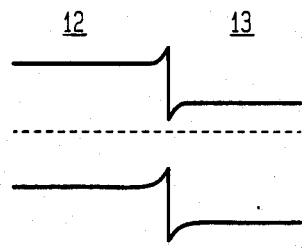
FIG. 7 (a) is an energy level diagram of undesirable base-collector junction and FIG. 7 (b) is another energy level diagram of undesirable base-collector junction.
Figure 7B:
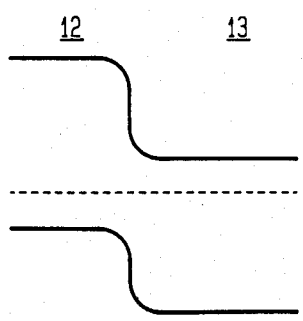

If the additional region 44 is not inserted, there are two possibilities in the energy level diagram obtained at the base-collector junction. One possibility is shown in FIG. 7(a). The edges of the conduction bands of the base 12 and the emitter 13 are curved so as to depart from each other and the edges of the valence bands are curved similarly. In this case, the electrons in the collector 13 may recombined with the holes in the base 12 by tunnel effect to lower the breakdown voltage of the base-collection junction. The other possibility is shown in FIG. 7(b). The edges of the conduction and valence bands of the base 12 and the collector 13 are curved so as to be close. The energy level diagram shown in FIG. 7(b) is obtained in the transistor shown in FIG. 3. Discontinuities exist in energy levels at the junction of base and collector. The above-mentioned features of the present invention can be obtained in the transistor of such case without lowering the breakdown voltage of the base-collection junction. The insertion of the additional region 44 may prevent the occurrence of the possibility shown in FIG. 7(a) and form the energy level structure shown in FIG. 6(b). The features of the present invention can be equally obtained in the transistor having the energy level structure shown in FIG. 6(b).

The semiconductor material of the additional region 44 has a grading edge of the conduction band which changes from those of the material of the base 12 to those of the materials of the collector 13. The lattice constant of semiconductor material of the additional region 44 is nearly the same as those of the semiconductor materials of the base 12 and the collector 13. Such grading may be obtained in a mixed semiconductor of a mixture of InP and GaAs-GaSb by changing the mixing ratio of them from GaAs-GaSb only at the junction with the base 12 to InP only at the junction with the collector 13. The relationship of the mixture InP and GaAs-GaSb is shown in FIG. 8. The edge 57 of the conduction band and the edge 57' of the valence band of the mixed semiconductor of InP and GaAs-GaSb changes from the corresponding edges 36 and 36' of GaAs-GaSb to the corresponding edges 34 and 34' of InP along the dotted line by changing the mixing ratio. The lattice constant is not changed so much by changing the mixing ratio. Such semiconductor of the additional region 44 is an N-type similar to the collector 13, and has a donor density of $10^{17}$ cm$^{-3}$. The thickness of the semiconductor is about 0.3 μm.

Although NPN type transistors are explained in the above, PNP type transistors may be similarly formed. In such case, the edge of the valence band of the collector semiconductor positions in the energy band gap of the base semiconductor and the edge of the conduction band of the collector semiconductor is outside the energy band gap of the base semiconductor. The semiconductor materials usable for the emitter, the base and the collector are not limited to the materials explained in the above. Any semiconductor materials satisfying the above-explained energy level relationship may be usable. Such semiconductor material may be selected from group IV semiconductors, group III-V compound semiconductors, group II-VI compound semiconductors, mixed semiconductors of compound semiconductors, semiconductors having a super lattice structure and other appropriate semiconductors.

What is claimed is:

1. A bipolar transistor comprising an emitter region of one conductivity type made of a first semiconductor material, a base region of the other conductivity type formed of a second semiconductor material in contact with said emitter region and a collector region of said one conductivity type formed of a third semiconductor material in contact with said base region, said first semiconductor material having a conduction band and a valence band positioned outside a band gap of said second semiconductor material under a non-bias condition, the edge of a conduction band of said third semiconductor material positioned inside said band gap of said second semiconductor material, and the edge of a valence band of said third semiconductor material positioned outside said band gap of said second semiconductor material.

2. A bipolar transistor as claimed in claim 1, wherein said one conductivity type is an N-type and said other conductivity type is a P-type.

3. A bipolar transistor as claimed in claim 1, wherein said second and third semiconductor materials are compound semiconductors and forms a hetero-junction.

4. A bipolar transistor as claimed in claim 3, wherein the difference between an edges of a conduction band of said second semiconductor material and the edge of said conduction band of said third semiconductor materials is within a range from 0.1 to 0.9 times of said band gap of said second semiconductor material and the difference between an edge of a valence band of said second semiconductor material and the edge of said valence band of said third semiconductor material is within a range from 0.1 to 0.9 times of a band gap of said third semiconductor material.

5. A bipolar transistor as claimed in claim 1, wherein said first semiconductor material is a mixed semiconductor of AlAs and GaSb, said second semiconductor material is a mixed semiconductor of GaAs and GaSb and said third semiconductor material is InP.

6. A bipolar transistor as claimed in claim 1, wherein said bipolar transistor comprises a additional region inserted between said base region and said collector region, said additional region being made of a fourth semiconductor material of said one conductivity type having edges of conduction and valence bands which are graded in energy level to establish continuous changes of conduction and valence bands between said base and collector regions.

7. A bipolar transistor as claimed in claim 6, wherein said fourth semiconductor material is a mixed semiconductor of GaAs, GaSb and InP.

8. A bipolar transistor comprising an emitter region of a first mixed semiconductor of AlAs and GaSb, a base region of a second mixed semiconductor of GaAs and GaSb and a collector region of InP.

9. A bipolar transistor as claimed in claim 8, wherein said bipolar transistor further comprises an additional region of a third mixed semiconductor of InP, GaAs and GaSb, said additional region being inserted between said base region and said collector region.

10. A bipolar transistor as claimed in claim 9, wherein said third mixed semiconductor is a mixture of InP and said second mixed semiconductor, the mixing ratio of said InP and said second mixed semiconductor being changed so as to change from said mixed semiconductor only at the junction with said base region to said InP at the junction with said collector region.

11. A bipolar transistor comprising an emitter region, a base region and a collection region, said base and collector regions being formed of such semiconductor materials that discontinuities of energy levels at a junction between said base and collector regions prevent injection of minority carriers into both said base and collector regions when said junction is forward biased.

12. A bipolar transistor as claimed in claim 11, wherein said junction is a hetero-junction.

13. A bipolar transistor as claimed in claim 12, wherein said bipolar transistor is an NPN type, and said collector region is made of a semiconductor material having an edge of conduction band positioned inside an energy band gap of a semiconductor material of said base region and an edge of valence band positioned outside said energy band gap of said semiconductor material of said base region.

14. A bipolar transistor as claimed in claim 12, wherein said bipolar transistor is a PNP type, and said collector region is made of a semiconductor material having an edge of conduction band positioned outside an energy band gap of a semiconductor material of said base region and an edge of valence band positioned inside said energy band gap of said semiconductor material of said base region.

15. A bipolar transistor comprising an emitter region of one conductivity type made of a first semiconductor material, a base region of the other conductivity type formed of a second semiconductor material in contact with said emitter region and a collector region of said one conductivity type formed of a third semiconductor material in contact with said base region, said first semiconductor material having a conduction band and a valence band positioned outside a band gap of said second semiconductor material under a non-bias condition, the edge of a valence band of said third semiconductor material positioned inside said band gap of said second semiconductor material, and the edge of a conduction band of said third semiconductor material positioned outside said band gap of said second semiconductor material.

16. A bipolar transistor as claimed in claim 15, wherein said one conductivity type is a P-type and said other conductivity type is an N-type.

17. A bipolar transistor as claimed in claim 15, wherein said second and third semiconductor materials are compound semiconductors and form a hetero-junction.

18. A bipolar transistor as claimed in claim 17, wherein the difference between an edge of a valence band of said second semiconductor material and the edge of said valence band of said third semiconductor materials is within a range from 0.1 to 0.9 times said band gap of said second semiconductor material and the difference between an edge of a conduction band of said second semiconductor material and the edge of said conduction band of said third semiconductor material is within a range from 0.1 to 0.9 times a band gap of said third semiconductor material.

19. A bipolar transistor as claimed in claim 15, wherein said first semiconductor material is a mixed semiconductor of AlAs and GaSb, said second semiconductor material is a mixed semiconductor of GaAs and GaSb and said third semiconductor material is InP.

20. A bipolar transistor as claimed in claim 15, wherein said bipolar transistor comprises an additional region inserted between said base region and said collector region, said additional region being made of a fourth semiconductor material of said one conductivity type having edges of conduction and valence bands which are graded in energy level to establish continuous changes of conduction and valence bands between said base and collector regions.

21. A bipolar transistor as claimed in claim 20, wherein said fourth semiconductor material is a mixed semiconductor of GaAs, GaSb and InP.

22. A bipolar transistor comprising an emitter region of a first mixed semiconductor of AlAs and GaSb, a base region of a second mixed semiconductor of GaAs and GaSb and a collector region of InP.

23. A bipolar transistor as claimed in claim 22, wherein said bipolar transistor further comprises an additional region of a third mixed semiconductor of InP, GaAs and GaSb, said additional region being inserted between said base region and said collector region.

24. A bipolar transistor as claimed in claim 23, wherein said third mixed semiconductor is a mixture of InP and said second mixed semiconductor, the mixing ratio of said InP and said second mixed semiconductor being changed so as to change from said mixed semiconductor only at the junction with said base region to said InP at the junction with said collector region.

* * * * *